United States Patent
Gao

(10) Patent No.: US 11,972,832 B2
(45) Date of Patent: Apr. 30, 2024

(54) COMMAND DECODER CIRCUIT, MEMORY, AND ELECTRONIC DEVICE

(71) Applicant: Changxin Memory Technologies, Inc., Anhui (CN)

(72) Inventor: Enpeng Gao, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 39 days.

(21) Appl. No.: 17/843,261

(22) Filed: Jun. 17, 2022

(65) Prior Publication Data

US 2023/0021725 A1 Jan. 26, 2023

Related U.S. Application Data

(63) Continuation of application No. PCT/CN2022/088953, filed on Apr. 25, 2022.

(30) Foreign Application Priority Data

Jul. 19, 2021 (CN) .......................... 202110811855.2

(51) Int. Cl.
*G11C 7/10* (2006.01)
*G11C 7/22* (2006.01)
*H03K 19/20* (2006.01)

(52) U.S. Cl.
CPC .......... *G11C 7/1039* (2013.01); *G11C 7/1063* (2013.01); *G11C 7/109* (2013.01); *G11C 7/222* (2013.01); *H03K 19/20* (2013.01)

(58) Field of Classification Search
CPC ..... G11C 7/1039; G11C 7/1063; G11C 7/109; G11C 7/222; G11C 11/4076; H03K 19/20

(Continued)

(56) References Cited

U.S. PATENT DOCUMENTS 10,424,367 B2 * 9/2019 Matsuno ............. G11C 11/4087
11,004,531 B2 5/2021 Chae
(Continued)

FOREIGN PATENT DOCUMENTS

CN 109949855 A 6/2019
TW 201102916 A 1/2011

OTHER PUBLICATIONS

PCT International Search Report and the Written Opinion dated Jul. 11, 2022, issued in related International Application No. PCT/CN2022/088953, with English translation (16 pages).

*Primary Examiner* — Fernando Hidalgo
(74) *Attorney, Agent, or Firm* — Sheppard Mullin Richter & Hampton LLP

(57) ABSTRACT

A command decoder circuit, a memory, and an electronic device are provided. The circuit includes a first decoder unit, configured to perform decoding for a first command signal based on a dynamic clock signal; a second decoder unit, configured to perform decoding for a second command signal based on the dynamic clock signal; and the clock gate, configured to generate the dynamic clock signal after a chip select signal of the first decoder unit indicates that decoding to be started for the first command signal and before the second decoder unit has performed decoding for the second command signal, and cut off the dynamic clock signal before the chip select signal of the first decoder unit indicates that the decoding to be started for the first command signal or after the second decoder unit has performed decoding for the second command signal.

19 Claims, 4 Drawing Sheets

(58) Field of Classification Search
 USPC .......................................................... 365/205
 See application file for complete search history.

(56) References Cited

U.S. PATENT DOCUMENTS

| | | | |
|---|---|---|---|
| 2011/0004703 A1 | 1/2011 | Murtuza et al. | |
| 2011/0161718 A1 | 6/2011 | Lin | |
| 2018/0108396 A1* | 4/2018 | Matsuno | G11C 7/1039 |
| 2018/0293026 A1* | 10/2018 | Hsieh | G06F 13/16 |
| 2019/0180803 A1* | 6/2019 | Jung | G11C 11/4076 |
| 2020/0150710 A1* | 5/2020 | Kim | G11C 7/222 |
| 2020/0302980 A1* | 9/2020 | Kwon | G11C 7/109 |
| 2020/0326886 A1* | 10/2020 | Kim | G11C 7/1093 |
| 2021/0358527 A1* | 11/2021 | Kwak | G11C 8/18 |
| 2022/0059146 A1* | 2/2022 | Kim | G11C 7/222 |

* cited by examiner

COMMAND DECODER CIRCUIT, MEMORY, AND ELECTRONIC DEVICE

CROSS-REFERENCE TO RELATED APPLICATIONS

This application is a continuation application of International Patent Application No. PCT/CN2022/088953, filed on Apr. 25, 2022, which claims priority to Chinese Patent Application No. 202110811855.2, filed with the China National Intellectual Property Administration on Jul. 19, 2021 and entitled "COMMAND DECODER CIRCUIT, MEMORY, AND ELECTRONIC DEVICE." The above-referenced applications are incorporated herein by reference in their entirety.

TECHNICAL FIELD

This invention relates to but is not limited to a command decoder circuit, a memory, and an electronic device.

BACKGROUND

Memories are indispensable parts of electronic devices, and impact their performance. Synchronous dynamic random-access memory (SDRAM) is a common memory product. Various types of SDRAMs have been produced, such as a low power double data rate SDRAM (LPDDR SDRAM). In the new LPDDR5 (the 5th generation of LPDDR) standard, two activate (ACT) commands ACT1 and ACT2 are defined, which are sequentially issued by a system chip and executed after being obtained through decoding.

In conventional technologies, decoding is performed for ACT1 and ACT2 based on a system clock signal provided by the system chip. The system clock signal constantly switches between a high level and a low level, resulting in high power consumption in decoding the activate commands.

SUMMARY

Embodiments of this invention provide a command decoder circuit. The command decoder circuit may include: a first decoder unit, a second decoder unit, and a clock gate. The first decoder unit may be configured to perform decoding for a first command signal based on a dynamic clock signal generated by a clock gate. The second decoder unit may be configured to perform decoding for a second command signal based on the dynamic clock signal generated by the clock gate. The second command signal may be triggered within a preset period after the first command signal. The clock gate may be configured to: generate the dynamic clock signal after a chip select signal of the first decoder unit indicates that decoding to be started for the first command signal and before decoding has been performed for the second command signal, and cut off the dynamic clock signal before the chip select signal indicates that the decoding to be started for the first command signal or after decoding has been performed for the second command signal.

Embodiments of this invention further provide a memory. The memory may include the foregoing command decoder circuit, a system chip, and a storage group.

The system chip may be configured to generate the system clock signal and trigger the first command signal and the second command signal.

The second command signal may be used to perform an operation on the storage group.

Embodiments of this invention further provide an electronic device. The electronic device may include the foregoing memory.

According to the command decoder circuit, the memory, and the electronic device provided in the embodiments of this invention, a system clock signal may be needed for the clock gate to generate the dynamic clock signal. The power consumption can be reduced by avoiding the clock signal from constantly switching between a high level and a low level before decoding is performed for a first activate command and after decoding is performed for a second activate command.

DETAILED DESCRIPTION OF THE EMBODIMENTS

The following clearly describes the technical solutions in the embodiments of this invention with reference to the accompanying drawings. Apparently, the embodiments described herein are merely some but not all of the embodiments of this invention. All the other embodiments obtained by persons of ordinary skills in the art based on the embodiments of this invention without creative efforts shall fall within the protection scope of this invention.

In the specification, claims, and accompanying drawings of this invention, the terms "first," "second" and the like may be used to distinguish between similar objects but do not necessarily indicate a specific order. It should be understood that the order illustrated or described herein may be interchangeable in proper circumstances so that the embodiments of this invention can be implemented in an order other than the order illustrated or described herein.

Moreover, the terms "include," "contain," and any other variants thereof are intended to cover a non-exclusive inclusion. For example, a process, method, system, product, or device that includes a list of steps or units is not necessarily limited to those steps or units expressly listed, but may include other steps or units not expressly listed or inherent to such a process, method, product, or device.

The embodiments of this invention are applicable to the decoding process of an activate command for reading data from a memory and writing data into the memory. The activate command obtained after decoding may be used for reading data from the memory and writing data into the memory, namely, a row operation. LPDDR is developed with the evolution of SDRAMs.

In LPDDR5, the activate command includes a first activate command and a second activate command. The first activate command is used to hold the following signals at a high level at the rising edge of a system clock signal: a chip select (CS) signal, a first command address (CA) signal CA0, a second CA signal CA1, and a third CA signal CA2. The second activate command is used to hold the CS signal at a high level, the CA0 at a high level, the CA1 at a high level, and the CA2 at a low level at the rising edge of the system clock signal. The second activate command is triggered within eight clock cycles after the first activate command is triggered. If the second activate command is not triggered within the eight clock cycles, a timeout is determined, after which the next first activate command shall be expected instead of the second activate command. Within the eight clock cycles, only a CA signal, a write signal, a read signal, a masked write signal, a mode register read (MRR) signal, a precharge signal, a storage group refresh signal, and the like can be triggered.

Figure 1:
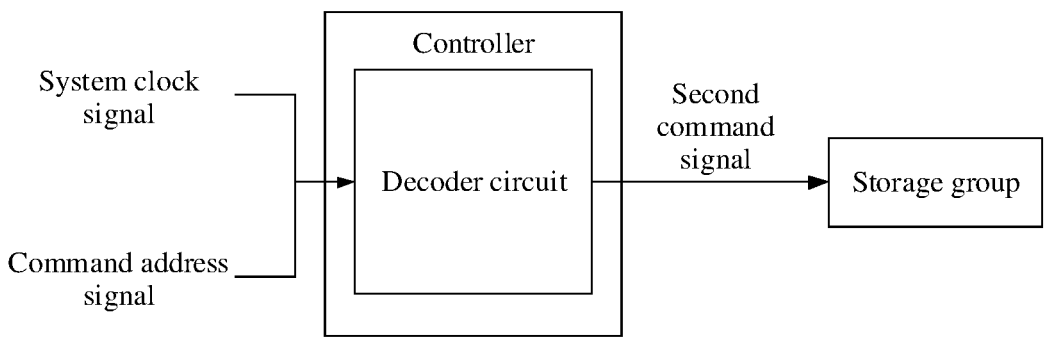
FIG. 1 is a schematic diagram illustrating the process of performing a row operation on a storage group in conventional technologies.

FIG. 1 is a schematic diagram illustrating the process of performing a row operation on a storage group in conventional technologies. Referring to FIG. 1, the controller includes a decoder circuit. The decoder circuit may decode a command address signal based on a system clock signal to obtain a first activate command ACT1 or a second activate command ACT2. The system clock signal is provided by a system chip. The second command signal decoded may be used to perform a row operation (i.e., data reading or data writing) on the storage group of the memory.

However, the system clock signal constantly switches between a high level and a low level, resulting in high power consumption of the decoder circuit.

To resolve the foregoing problem, it may be desired to stop the clock signal from switching between a high level and a low level when no decoding is needed.

According to the foregoing definitions of the first activate command and the second activate command, the second activate command is triggered within eight clock cycles after the first activate command is triggered. The triggering of the second activate command means that one data read/write command ends, and the next first activate command shall be expected. Therefore, the power consumption may be reduced by avoiding the clock signal from constantly switching between a high level and a low level before decoding is performed for the first activate command and after decoding is performed for the second activate command.

Figure 2:
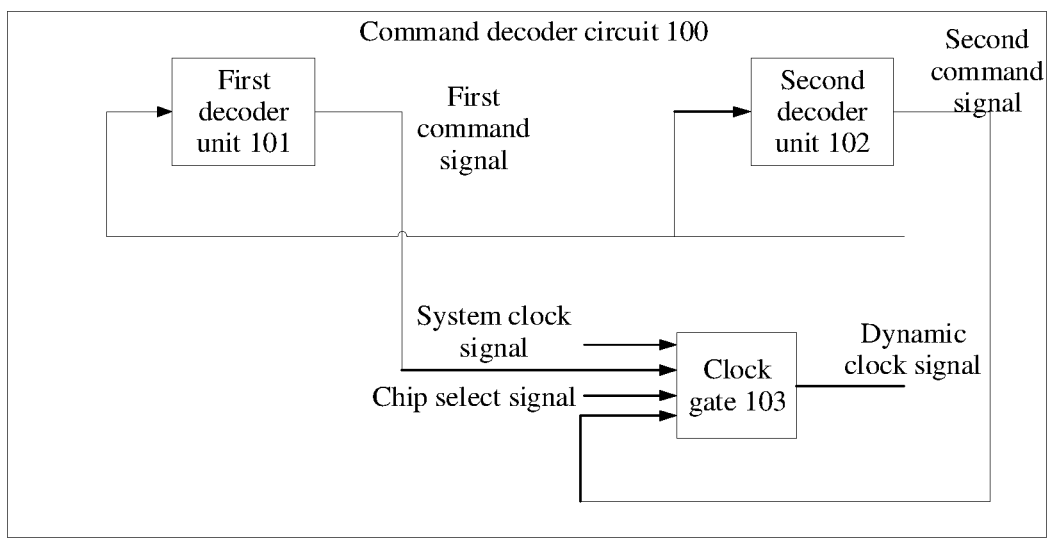
FIGS. 2, 3, 4, 5, and 6 are schematic structural diagrams illustrating a command decoder circuit according to the embodiments of this invention.

FIG. 2 is a schematic structural diagram illustrating a command decoder circuit 100 according to an embodiment of this invention. Referring to FIG. 2, the command decoder circuit 100 may include a first decoder unit 101, a second decoder unit 102, and a clock gate 103.

The first decoder unit 101 may be configured to perform decoding for a first command signal based on a dynamic clock signal generated by the clock gate 103.

The second decoder unit 102 may be configured to perform decoding for a second command signal based on the dynamic clock signal generated by the clock gate 103. The second command signal may be triggered within a preset period after the first command signal.

In this specification, the term "perform decoding for a signal" may refer to a process of generating the signal through a decoding process. Therefore, the first decoder unit 101 may be configured to generate the first command signal based on the dynamic clock signal generated by the clock gate 103, and the second decoder unit 102 may be configured to generate the second command signal based on the dynamic clock signal generated by the clock gate 103.

The clock gate 103 may be configured to: generate the dynamic clock signal after a chip select signal of the first decoder unit 101 indicates that decoding to be started for the first command signal and before the second decoder unit 102 has performed decoding for the second command signal, and cut off the dynamic clock signal before the chip select signal of the first decoder unit 101 indicates that the decoding to be started for the first command signal or after the second decoder unit 102 has performed decoding for the second command signal. As can be seen, a system clock signal may be needed for the clock gate 103 to generate the dynamic clock signal.

The first decoder unit 101 and the second decoder unit 102 may be the circuits for decoding CA signals to obtain the first command signal and the second command signal. The first command signal and the second command signal may be determined based on CA signals sent by command address lines.

The first command signal is a signal corresponding to the foregoing first activate command, and the second command signal is a signal corresponding to the foregoing second activate command. The first command signal may be used to trigger the second command signal, and the second command signal may be used to perform a row operation on a storage group. The operation may include but is not limited to reading data from the storage group and writing data into the storage group.

The first decoder unit 101 may perform decoding for the first command signal based on the dynamic clock signal. Because the dynamic clock signal is generated based on the chip select signal of the first decoder unit 101, the dynamic clock signal switching between a high level and a low level may be generated only when the chip select signal indicates that the first decoder unit 101 to start performing decoding, before which the dynamic clock signal is cut off. As such, the power consumption of the first decoder unit 101 can be reduced.

The second decoder unit 102 may perform decoding for the second command signal based on the dynamic clock signal generated by the clock gate 103. After decoding is performed for the first command signal and before decoding is performed for the second command signal, the dynamic clock signal may constantly switch between a high level and a low level just like the system clock signal. The dynamic clock signal may be cut off after decoding has been performed for the second command signal by the second decoder unit 102, after which the dynamic clock signal stops constantly switching between a high level and a low level but instead remains at a high level or a low level. As such, the power consumption of the second decoder unit 102 when performing decoding can be reduced.

To achieve the foregoing effect among the first command signal, the second command signal, the chip select signal, and the dynamic clock signal, the command decoder circuit may further include an enable signal generation unit 104. The enable signal generation unit 104 may be configured to generate an enable signal based on the first command signal and the second command signal.

Corresponding to the enable signal generation unit 104, the clock gate 103 may be further configured to generate the dynamic clock signal or cut off the dynamic clock signal based on the enable signal, the chip select signal, and the system clock signal.

When the chip select signal is at a low level (i.e., when the first decoder unit 101 has not started to perform decoding), the dynamic clock signal may be cut off. The chip select signal may be a high level when the first decoder unit 101 starts to perform decoding, and may be at a low level before the decoding is started.

When the chip select signal is at a high level and the first command signal or the second command signal is at a low level (i.e., when the first decoder unit 101 or the second decoder unit 102 is performing decoding), the dynamic clock signal may be generated so that the first decoder unit 101 or the second decoder unit 102 can perform decoding based on the dynamic clock signal.

When all of the chip select signal, the first command signal, and the second command signal are at a high level (i.e., when decoding has been performed for the first command signal and the second command signal), the dynamic clock signal may be cut off. Because the chip select signal is at a high level and the first command signal is also at a high level when decoding has been performed for the second command signal (i.e., when the second command signal is at a high level), the dynamic clock signal may be cut off.

To achieve the foregoing effect among the first command signal, the second command signal, the chip select signal, and the dynamic clock signal, the enable signal may be at a high level or a low level. The following describes two examples in detail.

In the first example, the enable signal generation unit 104 may be configured to generate a high-level enable signal when both the first command signal and the second command signal are at a high level, or generate a low-level enable signal when the first command signal or the second command signal is at a low level.

Correspondingly, the clock gate 103 may be configured to cut off the dynamic clock signal when the chip select signal is at a low level or the enable signal is at a high level, or generate the dynamic clock signal based on the system clock signal when the chip select signal is at a high level and the enable signal is at a low level.

Figure 3:
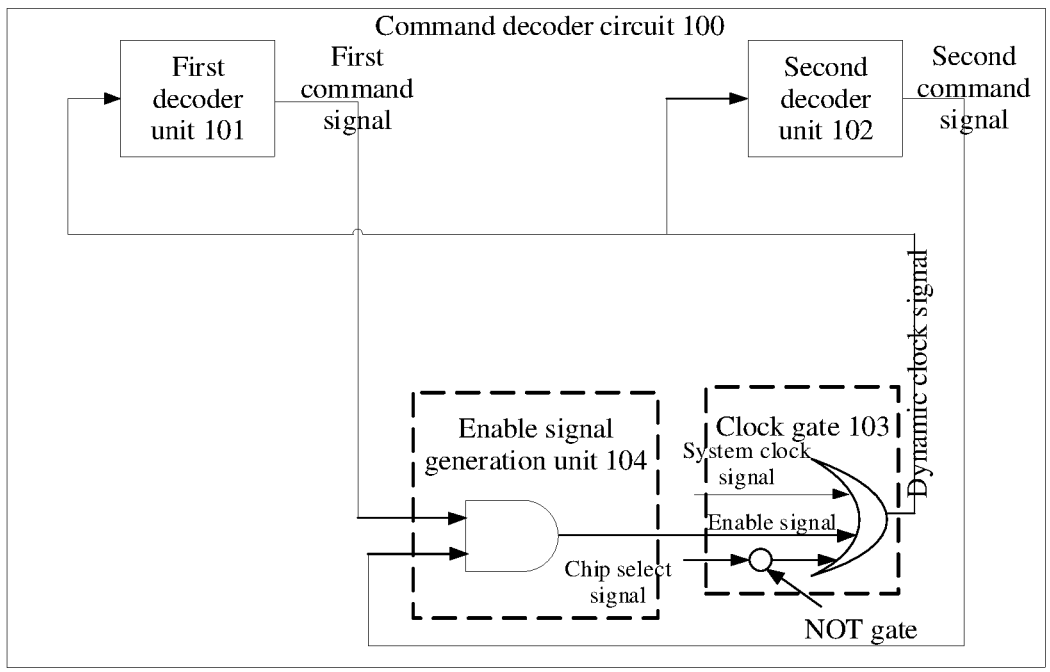

To achieve the foregoing effect among the first command signal, the second command signal, and the enable signal, the enable signal generation unit 104 may be an AND gate, as shown in FIG. 3.

The AND gate may be configured to determine the AND signal of the first command signal and the second command signal. That is, when the first command signal and the second command signal are at a high level, the enable signal is at a high level, and when the first command signal or the second command signal is at a low level, the enable signal is at a low level.

Corresponding to the enable signal generation unit 104 as shown in FIG. 3, the clock gate 103 may include a NOT gate and an OR gate. The NOT gate may be configured to obtain the NOT signal of the chip select signal. The OR gate may be configured to determine the OR signal of the NOT signal output by the NOT gate, the system clock signal, and the enable signal as the dynamic clock signal. That is, when the system clock signal, the enable signal, or the NOT signal of the chip select signal is at a high level, the dynamic clock signal is at a high level, and when all of the system clock signal, the enable signal, and the NOT signal of the chip select signal are at a low level, the dynamic clock signal is at a low level.

In this case, when the chip select signal is at a high level and the enable signal is at a low level, the NOT signal of the chip select signal is at a low level, and the OR signal of the NOT signal of the chip select signal and the enable signal is at a low level. Because the system clock signal switches between a high level and a low level, the OR signal of the system clock signal and the foregoing low level, namely, the output dynamic clock signal, may switch with the system clock signal. When the enable signal is at a high level or the chip select signal is at a low level, the NOT signal of the chip select signal is at a high level, and the OR signal of the NOT signal of the chip select signal and the enable signal is at a high level. Because the OR signal of the system clock signal and the foregoing high level, namely, the output dynamic clock signal, is always at a high level, the dynamic clock signal may be cut off.

In the second example, the enable signal generation unit 104 may be configured to generate a low-level enable signal when both the first command signal and the second command signal are at a high level, or generate a high-level enable signal when the first command signal or the second command signal is at a low level.

Correspondingly, the clock gate 103 may be configured to cut off the dynamic clock signal when the chip select signal or the enable signal is at a low level, or generate the dynamic clock signal based on the system clock signal when the enable signal and the chip select signal are at a high level.

Figure 4:
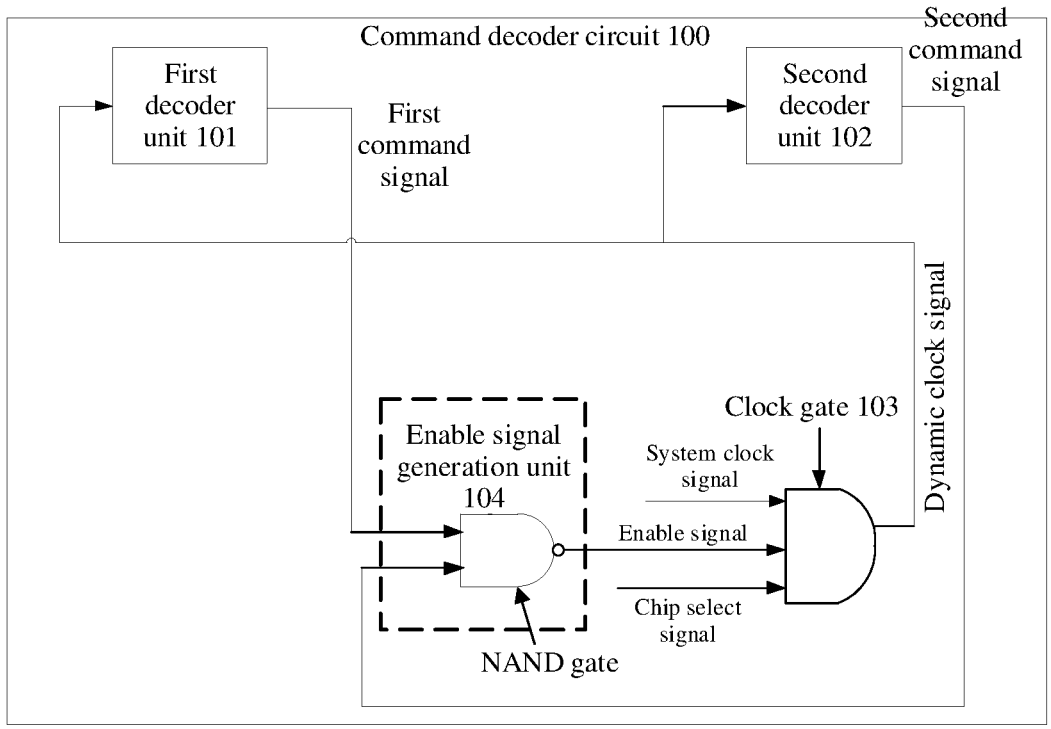

To achieve the foregoing effect among the first command signal, the second command signal, and the enable signal, the enable signal generation unit 104 may include an AND gate and a NOT gate. Referring to FIG. 4, the AND gate and the NOT gate may be combined into a NAND gate.

The AND gate may be configured to determine the AND signal of the first command signal and the second command signal. That is, when both the first command signal and the second command signal are at a high level, the AND signal output by the AND gate is at a high level, and when the first command signal or the second command signal is at a low level, the AND signal output by the AND gate is at a low level.

The NOT gate may be configured to use the NOT signal of the AND signal output by the AND gate as the enable signal. That is, when the AND signal output by the AND gate is at a high level, the NOT signal output by the NOT gate is at a low level, and the enable signal is at a low level, and when the AND signal output by the AND gate is at a low level, the NOT signal output by the NOT gate is at a high level, and the enable signal is at a high level.

Corresponding to the enable signal generation unit 104 as shown in FIG. 4, the clock gate 103 may include an AND gate. The AND gate may be configured to determine the AND signal of the system clock signal, the enable signal, and the chip select signal as the dynamic clock signal. That is, when all of the system clock signal, the enable signal, and the chip select signal are at a high level, the dynamic clock signal output by the clock gate 103 is at a high level, and when the system clock signal, the enable signal, or the chip select signal is at a low level, the dynamic clock signal output by the clock gate 103 is at a low level.

In this case, when the enable signal and the chip select signal are at a high level, the AND signal of the enable signal and the chip select signal is at a high level. Because the system clock signal switches between a high level and a low level, the AND signal of the system clock signal and the foregoing high level, namely, the dynamic clock signal, may switch with the system clock signal. When the enable signal or the chip select signal is at a low level, the AND signal of the enable signal and the chip select signal is at a low level. Because the AND signal of the foregoing low level and the system clock signal, namely, the dynamic clock signal, is always at a low level, the dynamic clock signal may be cut off.

In some embodiments, the command decoder circuit may further include a timer 105. The timer 105 may be configured to generate a timing signal after the first decoder unit 101 performs decoding for the first command signal. The timing signal may be used to indicate whether the duration between the current time and the time at which decoding was performed for the first command signal is greater than the preset period, and the timing signal may change with time. Correspondingly, the clock gate 103 may be further configured to cut off the dynamic clock signal when the duration between the current time and the time at which decoding was performed for the first command signal is greater than the preset period, or generate the dynamic clock signal when the duration between the current time and the time at which decoding was performed for the first command signal is less than or equal to the preset period.

The preset period may be eight clock cycles of the system clock signal as defined in the new LPDDR5 standard.

The timing signal may be a signal at different levels before or after the preset period is reached after decoding is performed for the first command signal. The following describes two types of timing signals.

For the first type of timing signal, after decoding is performed for the first command signal and before the preset period is reached (i.e., when the duration between the current time and the time at which decoding was performed for the first command signal is less than or equal to the preset period), the timing signal may be at a high level. After decoding is performed for the first command signal and after the preset period is reached (i.e., when the duration between the current time and the time at which decoding was performed for the first command signal is greater than the preset period), the timing signal may be at a low level.

For the second type of timing signal, after decoding is performed for the first command signal and before the preset period is reached (i.e., when the duration between the current time and the time at which decoding was performed for the first command signal is less than or equal to the preset period), the timing signal may be at a low level. After decoding is performed for the first command signal and after the preset period is reached (i.e., when the duration between the current time and the time at which decoding was performed for the first command signal is greater than the preset period), the timing signal may be at a high level. The second type of timing signal is used as the example to describe the relationship among the timing signal, the first command signal, the second command signal, and the dynamic clock signal in the following embodiments.

In some embodiments, if the second command signal is not triggered within the eight clock cycles after decoding is performed for the first command signal, a timeout may be determined, after which the second command signal may be not expected and the dynamic clock signal may be cut off, so that the dynamic clock signal is always at a high level or a low level. As such, power consumption can be further reduced.

In some embodiments, the timer 105 may be further configured to generate the timing signal based on the dynamic clock signal after the first decoder unit 101 performs decoding for the first command signal.

After decoding is performed for the first command signal, the dynamic clock signal may constantly switch between a high level and a low level just like the system clock signal. In this case, the timer 105 may generate the timing signal based on the dynamic clock signal that constantly switches between a high level and a low level to expect the second command signal or to determine a timeout. After decoding is performed for the second command signal or a timeout is determined, the timer 105 may not generate the timing signal since the dynamic clock signal is cut off, thereby reducing the power consumption.

The clock gate 103 may cut off the dynamic clock signal before the first decoder unit 101 performs decoding, or after decoding is performed for the second command signal or the timing signal indicates a timeout. In the rest of the time, the clock gate 103 may generate the dynamic clock signal.

To achieve the foregoing effect among the first command signal, the second command signal, the chip select signal, the timing signal, and the dynamic clock signal, the command decoder circuit may further include an enable signal generation unit 104. The enable signal generation unit 104 may be configured to generate an enable signal based on the first command signal, the second command signal, and the timing signal.

Corresponding to the enable signal generation unit 104, the clock gate 103 may be further configured to generate the dynamic clock signal or cut off the dynamic clock signal based on the chip select signal, the enable signal, and the system clock signal.

When the chip select signal is at a low level (i.e., when the first decoder unit 101 has not started to perform decoding), the dynamic clock signal may be cut off.

When the chip select signal is at a high level and the first command signal, the second command signal, or the timing signal is at a low level, (i.e., when the first decoder unit 101 or the second decoder unit 102 is performing decoding), the dynamic clock signal may be generated so that the first decoder unit 101 or the second decoder unit 102 can perform decoding based on the dynamic clock signal.

When both the chip select signal and the first command signal are at a high level and the second command signal or the timing signal is at a high level (i.e., when decoding has been performed for the first command signal and the second command signal or the second command signal is not triggered within eight clock cycles after decoding is performed for the first command signal), the dynamic clock signal may be cut off.

To achieve the foregoing effect among the first command signal, the second command signal, the chip select signal, the timing signal, and the dynamic clock signal, the enable signal may be at a high level or a low level. The following describes two examples in detail.

In the first example, the enable signal generation unit 104 may be configured to generate a high-level enable signal when the first command signal is at a high level and the second command signal or the timing signal is at a high level; or generate a low-level enable signal when the first command signal, the second command signal, or the timing signal is at a low level.

Correspondingly, the clock gate 103 may be configured to cut off the dynamic clock signal when the chip select signal is at a low level or the enable signal is at a high level, or generate the dynamic clock signal based on the system clock signal when the chip select signal is at a high level and the enable signal is at a low level.

Figure 5:
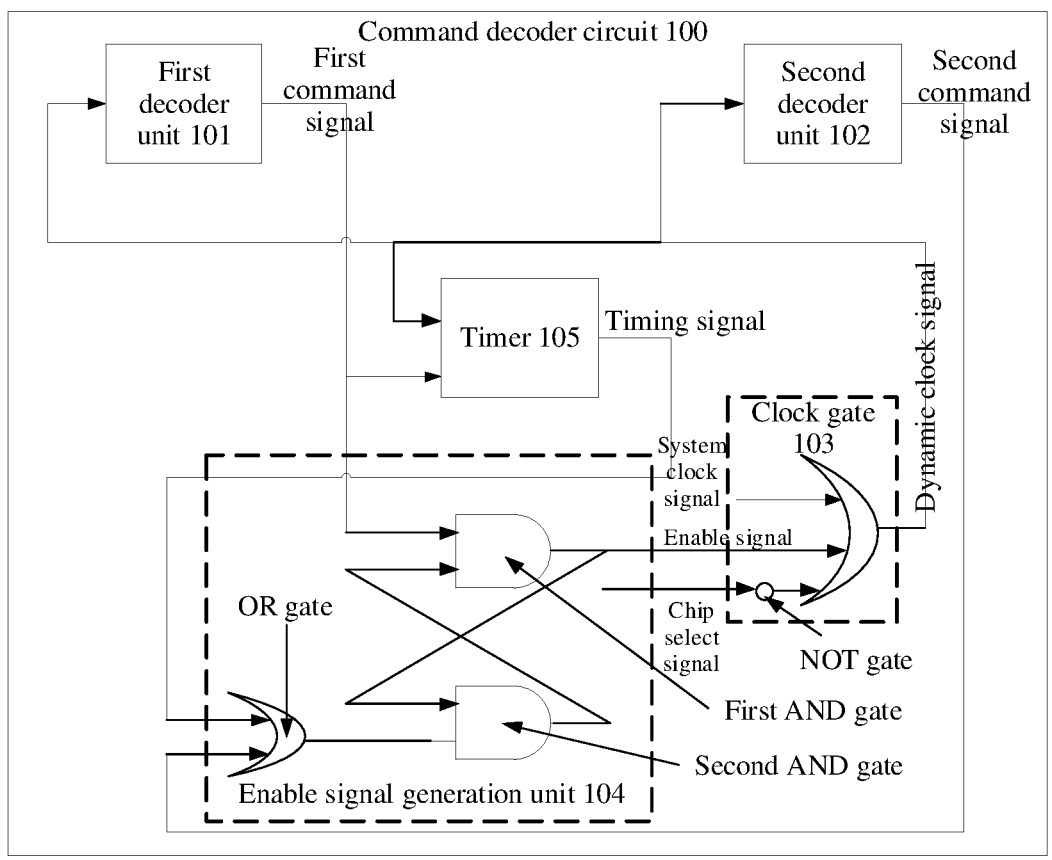

To achieve the foregoing effect among the first command signal, the second command signal, the timing signal, and the enable signal, the enable signal generation unit 104 may include an OR gate, a first AND gate, and a second AND gate, as shown in FIG. 5.

The OR gate may be configured to determine the OR signal of the second command signal and the timing signal. That is, when at least one of the second command signal and the timing signal is at a high level, the OR signal is at a high level; and when both the second command signal and the timing signal are at a low level, the OR signal is at a low level.

The first AND gate may be configured to determine the AND signal of the first command signal and the AND signal output by the second AND gate. The AND signal output by the first AND gate may be the enable signal. That is, when both the first command signal and the AND signal output by the second AND gate are at a high level, the AND signal output by the first AND gate is at a high level, and the enable signal is at a high level; and when the first command signal or the AND signal output by the second AND gate is at a low level, the AND signal output by the first AND gate is at a low level, and the enable signal is at a low level.

The second AND gate may be configured to determine the AND signal of the OR signal output by the OR gate and the AND signal output by the first AND gate. That is, when both the OR signal output by the OR gate and the AND signal output by the first AND gate are at a high level, the AND signal output by the second AND gate is at a high level; and when the OR signal output by the OR gate or the AND signal output by the first AND gate is at a low level, the AND signal output by the second AND gate is at a low level.

Corresponding to the enable signal generation unit 104 as shown in FIG. 5, the clock gate 103 may include a NOT gate and an OR gate. The NOT gate may be configured to obtain the NOT signal of the chip select signal. The OR gate may be configured to determine the OR signal of the NOT signal output by the NOT gate, the system clock signal, and the enable signal as the dynamic clock signal. That is, when the system clock signal, the enable signal, or the NOT signal is at a high level, the dynamic clock signal is at a high level; and when all of the system clock signal, the enable signal, and the NOT signal are at a low level, the dynamic clock signal is at a low level.

In this case, when the chip select signal is at a high level and the enable signal is at a low level, the NOT signal of the chip select signal is at a low level, and the OR signal of the NOT signal of the chip select signal and the enable signal is at a low level. Because the system clock signal switches between a high level and a low level, the OR signal of the system clock signal and the foregoing low level, namely, the output dynamic clock signal, may switch with the system clock signal. When the enable signal is at a high level or the chip select signal is at a low level, the NOT signal of the chip select signal is at a high level, and the OR signal of the NOT signal of the chip select signal and the enable signal is at a high level. Because the OR signal of the system clock signal and the foregoing high level, namely, the output dynamic clock signal, is always at a high level, the dynamic clock signal may be cut off.

In the second example, the enable signal generation unit 104 may be configured to generate a low-level enable signal when the first command signal is at a high level and the second command signal or the timing signal is at a high level, or generate a high-level enable signal when the first command signal, the second command signal, or the timing signal is at a low level.

Correspondingly, the clock gate 103 may be configured to cut off the dynamic clock signal when the chip select signal or the enable signal is at a low level, or generate the dynamic clock signal based on the system clock signal when the chip select signal and the enable signal are at a high level.

Figure 6:
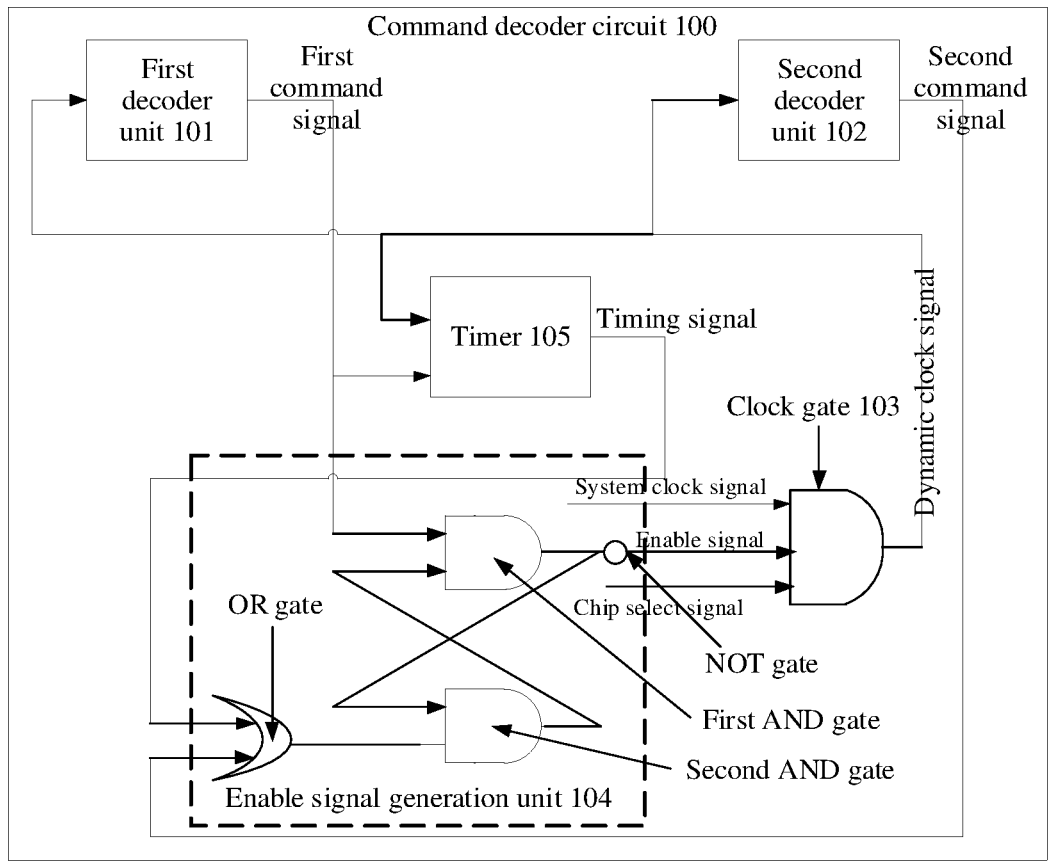

To achieve the foregoing effect among the first command signal, the second command signal, the timing signal, and the enable signal, the enable signal generation unit 104 may include an OR gate, a first AND gate, a second AND gate, and a NOT gate, as shown in FIG. 6.

The OR gate may be configured to determine the OR signal of the second command signal and the timing signal. That is, when at least one of the second command signal and the timing signal is at a high level, the OR signal is at a high level; and when both the second command signal and the timing signal are at a low level, the OR signal is at a low level.

The first AND gate may be configured to determine the AND signal of the first command signal and the AND signal output by the second AND gate. That is, when both the first command signal and the AND signal output by the second AND gate are at a high level, the AND signal output by the first AND gate is at a high level; and when the first command signal or the AND signal output by the second AND gate is at a low level, the AND signal output by the first AND gate is at a low level.

The second AND gate may be configured to determine the AND signal of the OR signal output by the OR gate and the AND signal output by the first AND gate. That is, when both the OR signal output by the OR gate and the AND signal output by the first AND gate are at a high level, the AND signal output by the second AND gate is at a high level; and when the OR signal output by the OR gate or the AND signal output by the first AND gate is at a low level, the AND signal output by the second AND gate is at a low level.

The NOT gate may be configured to use the NOT signal of the AND signal output by the first AND gate as the enable signal.

Corresponding to the enable signal generation unit 104 as shown in FIG. 6, the clock gate 103 may include an AND gate. The AND gate may be configured to determine the AND signal of the system clock signal, the enable signal, and the chip select signal as the dynamic clock signal. That is, when all of the system clock signal, the enable signal, and the chip select signal are at a high level, the dynamic clock signal output by the clock gate 103 is at a high level; and when the system clock signal, the enable signal, or the chip select signal is at a low level, the dynamic clock signal output by the clock gate 103 is at a low level.

In this case, when the enable signal and the chip select signal are at a high level, the AND signal of the enable signal and the chip select signal is at a high level. Because the system clock signal switches between a high level and a low level, the AND signal of the system clock signal and the foregoing high level, namely, the dynamic clock signal, may switch with the system clock signal. When the enable signal or the chip select signal is at a low level, the AND signal of the enable signal and the chip select signal is at a low level. Because the AND signal of the foregoing low level and the system clock signal, namely, the dynamic clock signal, is always at a low level, the dynamic clock signal may be cut off.

Figure 7:
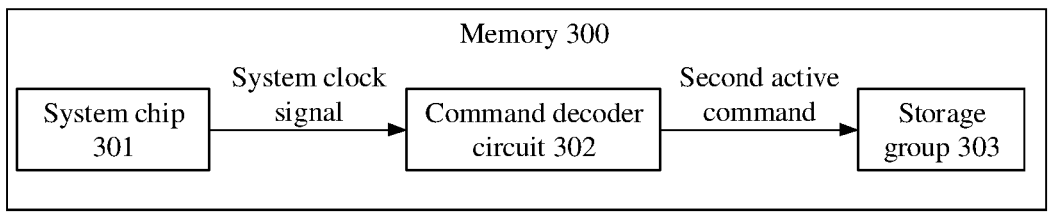
FIG. 7 is a schematic structural diagram illustrating a memory according to the embodiments of this invention.

FIG. 7 is a schematic structural diagram illustrating a memory according to the embodiments of this invention. The memory may include a command decoder circuit 302, a system chip 301, and a storage group 303.

The system chip 301 may be configured to generate a system clock signal and trigger a first command signal and a second command signal. The second command signal may be used to perform an operation on the storage group 303, for example, a row operation.

The command decoder circuit 302 may be configured to perform decoding for the first command signal and the second command signal.

In some embodiments, the memory may be an LPDDR SDRAM.

This invention further provides an electronic device. The electronic device may include the foregoing memory.

It should be noted that the foregoing embodiments are merely intended for describing the technical solutions of this invention other than limiting this invention. Although this invention is described in detail with reference to the foregoing embodiments, persons of ordinary skills in the art should understand that they may make modifications to the technical solutions described in the foregoing embodiments or make equivalent replacements to some or all technical features thereof, without departing from the scope of the technical solutions of the embodiments of this invention.

For ease of explanation, the foregoing descriptions are provided with reference to specific implementations. However, the foregoing descriptions are not intended to be exhaustive or limit the implementations to those disclosed herein. According to the foregoing teachings, various modifications and variations may be obtained. The foregoing implementations are selected and described for the better explanation of the principle and actual application of this invention, so that persons skilled in the art can better use the implementations disclosed herein and make various variations based on actual needs.

What is claimed is:

1. A command decoder circuit, comprising:
   a first decoder unit, configured to generate a first command signal based on a dynamic clock signal generated by a clock gate;
   a second decoder unit, configured to generate a second command signal based on the dynamic clock signal generated by the clock gate, the second command signal being triggered within a preset period after the first command signal; and
   the clock gate, configured to generate the dynamic clock signal when a chip select signal of the first decoder unit indicates the first command signal is generated and before the second command signal is generated, and cut off the dynamic clock signal when the chip select signal indicates that the first command signal has not been generated, or after the second command signal is generated.

2. The command decoder circuit of claim 1, further comprising:
   an enable signal generation unit, configured to generate an enable signal based on the first command signal and the second command signal, wherein
   the clock gate is further configured to generate the dynamic clock signal or cut off the dynamic clock signal based on the chip select signal, the enable signal, and a system clock signal.

3. The command decoder circuit of claim 2, wherein the enable signal generation unit is further configured to:
   generate a high-level enable signal in response to both the first command signal and the second command signal being at a high level; or
   generate a low-level enable signal in response to the first command signal or the second command signal being at a low level, and wherein
   the clock gate is further configured to:
   cut off the dynamic clock signal in response to the chip select signal being at a low level or the enable signal being at a high level; or
   generate the dynamic clock signal based on the system clock signal in response to the chip select signal being at a high level and the enable signal being at a low level.

4. The command decoder circuit of claim 3, wherein the enable signal generation unit comprises:
   an AND gate, configured to determine an AND signal of the first command signal and the second command signal as the enable signal, and wherein
   the clock gate comprises:
   a NOT gate, configured to obtain a NOT signal of the chip select signal; and
   an OR gate, configured to determine an OR signal of the NOT signal, the enable signal, and the system clock signal as the dynamic clock signal.

5. The command decoder circuit of claim 2, wherein the enable signal generation unit is further configured to:
   generate a low-level enable signal in response to both the first command signal and the second command signal being at a high level; or
   generate a high-level enable signal in response to the first command signal or the second command signal being at a low level, and wherein
   the clock gate is further configured to:
   cut off the dynamic clock signal in response to the chip select signal or the enable signal being at a low level; or
   generate the dynamic clock signal based on the system clock signal in response to the chip select signal and the enable signal being at a high level.

6. The command decoder circuit of claim 5, wherein the enable signal generation unit comprises:
   an AND gate, configured to determine an AND signal of the first command signal and the second command signal; and
   a NOT gate, configured to use a NOT signal of the AND signal as the enable signal, and wherein
   the clock gate is an AND gate, configured to determine an AND signal of the system clock signal, the enable signal, and the chip select signal as the dynamic clock signal.

7. The command decoder circuit of claim 1, further comprising:
   a timer, configured to generate a timing signal after the first decoder unit generates the first command signal, wherein the timing signal is used to indicate whether a duration between a current time and a time at which the first command signal is generated is greater than the preset period, and the timing signal changes with time, and wherein
   the clock gate is further configured to cut off the dynamic clock signal in response to the duration being greater than the preset period.

8. The command decoder circuit of claim 7, wherein
   the timer is further configured to generate the timing signal based on the dynamic clock signal after the first decoder unit generates the first command signal.

9. The command decoder circuit of claim 8, further comprising:
   an enable signal generation unit, configured to generate an enable signal based on the first command signal, the second command signal, and the timing signal, wherein
   the clock gate is further configured to generate the dynamic clock signal or cut off the dynamic clock signal based on the chip select signal, the enable signal, and a system clock signal.

10. The command decoder circuit of claim 9, wherein the enable signal generation unit is further configured to:
    generate a high-level enable signal in response to the first command signal being at a high level and the second command signal or the timing signal being at a high level; or
    generate a low-level enable signal in response to the first command signal, the second command signal, or the timing signal being at a low level, and wherein
    the clock gate is further configured to:
    cut off the dynamic clock signal in response to the chip select signal being at a low level or the enable signal being at a high level; or generate the dynamic clock signal based on the system clock signal in response to the chip select signal being at a high level and the enable signal being at a low level.

11. The command decoder circuit of claim 10, wherein the enable signal generation unit comprises:
   an OR gate, configured to determine an OR signal of the second command signal and the timing signal;
   a first AND gate, configured to determine an AND signal of the first command signal and an AND signal output by a second AND gate, wherein the AND signal output by the first AND gate is the enable signal; and
   the second AND gate, configured to determine an AND signal of the OR signal and the AND signal output by the first AND gate, and wherein
   the clock gate comprises:
   a NOT gate, configured to obtain a NOT signal of the chip select signal; and
   an OR gate, configured to determine an OR signal of the NOT signal, the enable signal, and the system clock signal as the dynamic clock signal.

12. The command decoder circuit of claim 9, wherein the enable signal generation unit is further configured to:
   generate a low-level enable signal in response to the first command signal being at a high level and the second command signal or the timing signal being at a high level; or
   generate a high-level enable signal in response to the first command signal, the second command signal, or the timing signal being at a low level, and wherein
   the clock gate is further configured to:
   cut off the dynamic clock signal in response to the chip select signal or the enable signal being at a low level; or
   generate the dynamic clock signal based on the system clock signal in response to the chip select signal and the enable signal being at a high level.

13. The command decoder circuit of claim 12, wherein the enable signal generation unit comprises:
   an OR gate, configured to determine an OR signal of the second command signal and the timing signal;
   a first AND gate, configured to determine an AND signal of the first command signal and an AND signal output by a second AND gate;
   the second AND gate, configured to determine an AND signal of the OR signal and the AND signal output by the first AND gate; and
   a NOT gate, configured to use a NOT signal of the AND signal output by the first AND gate as the enable signal; and wherein
   the clock gate is an AND gate, configured to determine an AND signal of the system clock signal, the enable signal, and the chip select signal as the dynamic clock signal.

14. The command decoder circuit of claim 7, wherein the timing signal being at a low level indicates that the duration between the current time and the time at which the first command signal is generated is less than or equal to the preset period, and
   the timing signal being at a high level indicates that the duration between the current time and the time at which the first command signal is generated is greater than the preset period.

15. The command decoder circuit of claim 1, wherein the preset period is eight cycles of a system clock signal.

16. The command decoder circuit of claim 1, wherein the first command signal is configured to trigger the second command signal, and wherein the second command signal is configured to perform a row operation on a storage group.

17. A memory, comprising:
   the command decoder circuit of claim 2, a system chip, and a storage group, wherein
   the system chip is configured to generate the system clock signal and trigger the first command signal and the second command signal; and wherein
   the second command signal obtained by the second decoder unit through decoding is configured to perform a row operation on the storage group.

18. The memory of claim 17, wherein the memory is a low power double data rate synchronous dynamic random-access memory (LPDDR SDRAM).

19. An electronic device, comprising the memory of claim 17.

* * * * *